United States Patent [19]
Jelloian et al.

[11] Patent Number: 5,646,069
[45] Date of Patent: Jul. 8, 1997

[54] FABRICATION PROCESS FOR $AL_xIN_{1-x}AS/GA_yIN_{1-y}AS$ POWER HFET OHMIC CONTACTS

[75] Inventors: Linda Jelloian, Northridge; Mehran Matloubian, Encino; Loi D. Nguyen, Thousand Oaks; Adele Schmitz, Newbury Park, all of Calif.

[73] Assignee: Hughes Aircraft Company, Los Angeles, Calif.

[21] Appl. No.: 472,165

[22] Filed: Jun. 7, 1995

[51] Int. Cl.$^6$ .......................... H01L 29/45; H01L 21/283
[52] U.S. Cl. ............................................. 437/184; 437/190
[58] Field of Search ................................. 437/184, 185, 437/189, 190; 257/743, 745

[56] References Cited

U.S. PATENT DOCUMENTS

| | | | |
|---|---|---|---|
| 3,890,699 | 6/1975 | Vilms | 437/184 |
| 4,186,410 | 1/1980 | Cho et al. | 437/184 |
| 5,077,599 | 12/1991 | Yano et al. | 437/184 |
| 5,100,835 | 3/1992 | Zheng | 437/184 |
| 5,387,549 | 2/1995 | Kobayashi | 437/184 |

OTHER PUBLICATIONS

O'Conner et al, "Gold–Germanium based ohmic contacts"; IEEE transactions on Electron Devices, Ed–34, No. 4, pp. 765–771 Apr. 1987.

Sircar, P. "Laser and furnace annealed Au, Ag and Al ohmic contacts on N+GaAs"; Revue de Physique Appliquee, vol. 22, No. 9, pp. 967–969 Sep. 1987.

Mukherjee, S.D. et al, "As2–Ambient activation and alloyed–ohmic–contact studies of Si+–ion implanted AlGaAs/GaAs modulation–doped structures"; Solid state electronics, vol. 29, No. 2, pp. 181–187 Feb. 1986.

Ehara, T. et al, "Contact resistivity and adhesion of Ni/AuGe/Ag/Au ohmic contact directly to n–type AlGaAs"; Japanes Journal of Applied Physics, vol. 34, No. 6a, pp. 3051–3053 Jun. 1995.

Capani, P.M., et al., "Low Resistance Alloyed Ohmic Contacts", Electronics Letters, May 24, 1984, vol. 20, No. 11, pp. 446–447.

P. Zwicknagl., et al., "Very Low Resistance Ohmic Contact Fabrication", paper presented at the 11th International Symposium on GaAs & Related, Sep. 26–28, 1984.

Wu, C.S., et al., "Optimization of Ohmic Contacts", Journal of Electronic Materials, vol. 19, No. 11, 1990, pp. 1265–1271.

Reeves, G.K., et al., "Obtaining the Specific Contact Resistance from Transmission Line Measurements", IEEE Electron Device Letters, May, 1982, vol. EDL–3, No. 5, pp. 111–113.

Cunnell, J.T., et al., "Technology of Gallium Arsenide", Solid–State Electronics, Pergamon Press, Great Britain, 1960, vol. 1, pp. 97–106.

Williams, R.E., et al., "Ohmic Contacts–Gallium Arsenide Processing Techniques", Artech House, Inc., 1984, Chapter 11, pp. 225–256.

Braslau, N., et al., "Metal–Semiconductor Contacts for GaAs Bulk Effect Devices", Solid–State Electronics, Pergamon Press, Great Britain, 1967, vol. 10, pp. 381–383.

*Primary Examiner*—George Fourson
*Assistant Examiner*—Scott Kirkpatrick
*Attorney, Agent, or Firm*—V. D. Duraiswamy; W. K. Denson-Low

[57] ABSTRACT

A metal system that can be adjusted to obtain higher alloying temperatures in AlInAs/GaInAs heterostuctures is disclosed. Increasing the thickness of a Ag layer in the metal system facilitates higher alloying temperatures and, consequently, improved ohmic contact reliability. The system is particularly directed to use in $Al_xIn_{1-x}As/Ga_{0.47}In_{0.53}As$ with $0.48<x<1$ power HFETs.

8 Claims, 4 Drawing Sheets

FABRICATION PROCESS FOR AL$_x$IN$_{1-x}$AS/ GA$_y$IN$_{1-y}$AS POWER HFET OHMIC CONTACTS

BACKGROUND OF THE INVENTION

1. Field of the Invention

The present invention relates generally to ohmic contacts and more particularly to ohmic contacts for Al$_x$In$_{1-x}$As/ Ga$_y$In$_{1-y}$As power HFETs.

2. Description of the Related Art

In typical heterostructure field-effect transistors (HFET), a layer of a high-bandgap semiconductor is epitaxially grown over a low-bandgap semiconductor layer. The upper layer is selectively doped to facilitate the formation of a potential well at the heterojunction interface. Electrons from ionized donors in the high-bandgap material are trapped in this well; they are free to move in a plane that is parallel with the heterojunction but are confined in a direction orthogonal to that plane. As a result, the electron system at the heterojunction has a two-dimensional characteristic which is typically referred to as a two-dimensional electron gas (2DEG).

This sheet of conduction electrons forms a channel between the source and drain of the HFET and electron flow through this channel is modulated by the field effect from a gate electrode. Because the conduction electrons are separated from the dopants of their high-bandgap material, they can move with essentially no ionized impurity scattering. Therefore, the electron mobility between the source and drain of the HFET is significantly enhanced, especially at lower temperatures where the ionized impurity scattering is the dominant scattering mechanism.

Two semiconductor systems that have demonstrated particularly promising HFET performance are the AlGaAs/ GaAs and AlInAs/GaInAs systems (the semiconductors of the system are typically listed in a high-bandgap/low-bandgap order). In general, these two systems are fabricated respectively on GaAs and InP substrates. The former system is inherently lattice-matched to its substrate; the latter system is typically fabricated with an alloy composition of Al0.48In0.52As/Ga0.47In0.53As to achieve a lattice match with its InP substrate. Because of their high output voltage swings and high voltage bias points, power HFETs require a large gate-drain breakdown voltage. Higher breakdown voltages can be obtained with higher bandgap materials. Accordingly, power HFETs in the AlInAs/GaInAs system are generally fabricated with an alloy composition of Al$_x$In$_{1-x}$As/Ga$_y$In$_{1-y}$As with x>0.48. The additional Al content increases the material's bandgap which produces the desired increase in breakdown voltage.

In any HFET semiconductor system, low-resistance source and drain ohmic contacts must be fabricated to communicate with the 2DEG channel in order to take advantage of the high-mobility electrons of that structure. N-type, ohmic contacts in the AlGaAs/GaAs system have typically been fabricated with a AuGeNi metal system which is alloyed to penetrate the high-bandgap semiconductor and reach the 2DEG.

In this semiconductor system, as reported by R. E. Williams (Williams, R. E., et al. "Ohmic Contacts", *Gallium Arsenide Processing Techniques*, Artech House, 1984, Chapter 11), it is theorized that Ga diffuses into the Au, which frees Ga crystal sites for occupation by Ge to form a narrow potential barrier which facilitates an ohmic current by tunneling emission. The Ni apparently serves as a wetting agent to prevent "balling up" of Au/Ge during alloying. The Ge is generally applied as a precompounded alloy of Au and Ge in a eutectic proportion. An overlay of Au is often used to improve the surface morphology of the contact.

A third HFET semiconductor system is the pseudomorphic AlGaAs/GaInAs system. A pseudomorphic structure has an intentional lattice mismatch which is accommodated by coherent layer strain when the layers are thinner than a critical thickness. C. S. Wu, et al. (C. S. Wu, et al. "Optimization of Ohmic Contacts for Reliable Heterostructure GaAs Materials", *Journal of Electronic Materials*, Vol. 19, No. 11, pp. 1265–1271) addressed ohmic contacts in the AlGaAs/GaAs semiconductor system and the pseudomorphic AlGaAs/GaInAs semiconductor system. They observed that the use of high temperature alloying to obtain penetration to the 2DEG resulted in high contact resistance and rough surface morphology in AuGe based metal systems. They tested the addition of a Ag diffusion barrier in a metal system which was deposited in the sequence of Ni (80 Å)/AuGe(900 Å)/Ag(1200 Å)/Au(1200 Å). This system produced a smooth surface morphology and a low contact resistance with 460° C. alloying.

However, as reported by Capani, et al., (Capani, P. M., et al "Low Resistance Alloyed Ohmic Contacts", *Electronics Letters*, May 24, 1984, Vol. 20, No. 11) it has proven to be difficult to fabricate high-quality ohmic contacts in the AlInAs/GaInAs semiconductor system. In a first experiment with this semiconductor system, Capani, et al. sequentially evaporated a AuGeNi(1500 Å)/Ag(1000 Å)/Au(1500 Å) metal system followed by a standard alloying technique. This produced an unacceptably high ohmic contact resistance ($\sim 10^{-4} \Omega cm^2$). Subsequent analysis by Capani, et al. found gross Ag indiffusion into the semiconductor and significant In depletion. Capani, et al. theorized that the altered semiconductor stoichiometry resulted from the well known Ag-In affinity.

In a second experiment, Capani, et al. sequentially evaporated Ni (100 Å)/Ge(365 Å)/Au(800 Å/Ag(200)/Au(800 Å), i.e., the Ag was reduced to avoid gross Ag-In interaction. Capani, et al. stated, "Some Ag was added as a solute for Au-Ag alloy formation which is known to reduce Au-Ga affinity as substantial Ga loss under ohmic contacts on GaAs is known to degrade contact resistance." Low contact resistance was obtained in this second attempt, which led Capani, et al. to conclude that the low resistance was obtained through, "—controlled alloying of AuGeNiAg metallisation. The metallisation was chosen so as to reduce Ga loss from the semiconductor by incorporating Ag within Au, the quantity of which was limited in order to prevent substantial In outdiffusion owing to In-Ag affinity."

In further comment on the use of Ag, P. Zwicknagl, et al. (Zwicknagl, et al. "Very Low Resistance Ohmic Contact Fabrication", Paper presented at 1th *International Symposium on GaAs & Related CPDS*, Biarritz, Sep. 25–28, 1994) also warned, "The presence of In in the AlGaAs/GaInAs system warrants considerable reduction in Ag in the ohmic metallization, the presence of Ag for the AlGaAs/GaAs case being required for the sake of reducing excessive Ga out-diffusion at higher temperatures."

The experiments of Capani, et al. emphasize that ohmic contact development must be approached independently for each semiconductor system. As stated by R. E. Williams (Williams, R. E., et al. loc. cit., pp. 232), "A complete understanding of ohmic behavior in metal-semiconductor contacts is yet to be achieved. Even though the underlying physics seem well established, exactly what occurs during actual processes used to fabricate ohmic contacts is much less clear. The importance of ohmic contacts for fabricating devices has inspired a great many experimental and empirical approaches to the problem."

SUMMARY OF THE INVENTION

The present invention is directed to a metal system and method for forming high-reliability, low-contact resistance ohmic contacts to a region adjoining a heterojunction in a semiconductor heterostructure whose alloy proportions are substantially $Al_xIn_{1-x}As/Ga_yIn_{1-y}As$ with $x>0.48$.

The metal system is characterized by sequentially deposited layers of Ni/AuGe/Ag/Au in which the thickness of the Ag layer is selected from a range of substantially 400–1600 Å. In accordance with a feature of the invention, increasing the thickness of the Ag layer facilitates the use of increased alloying temperatures at easily controlled alloying times, e.g., 30–60 seconds, when forming the ohmic contacts. It has been demonstrated that increased alloying temperatures of this metal system increases the reliability of the ohmic contacts.

The invention is particularly suited for realizing ohmic contacts to the 2DEG sheet that typically adjoins a heterojunction in power HFETs.

In order to control other ohmic contact parameters, e.g., surface morphology, the Ni, AuGe and Au layer thicknesses are preferably selected from respective ranges of substantially 50–100Å, 600–1200 Å and 1000–1500 Å. The AuGe layer is preferably deposited in eutectic proportions.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
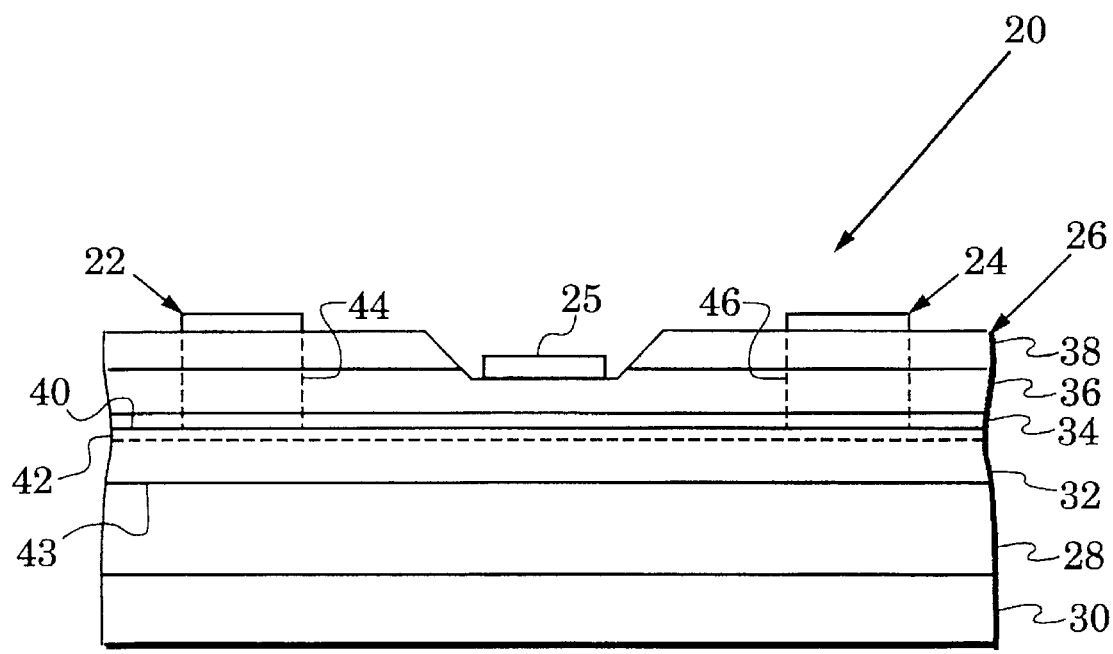
FIG. 1 is a sectional view of a typical, recessed gate HFET.

FIG. 1 illustrates a simplified, typical recessed-gate HFET 20. The HFET 20 includes source and drain ohmic contacts 22 and 24 and an insulated gate 25 in association with a heterostructure 26 that is formed with an AlInAs/GaInAs semiconductor system. The heterostructure 26 includes a buffer layer 28 that is grown over a semi-insulating InP substrate 30. In sequential order above the buffer 28, are a GaInAs channel layer 32, an undoped AlInAs spacer layer 34, an n+ AlInAs donor layer 36 and an n+ GaAs cap layer 38.

In the HFET 20, the semiconductor material of the donor layer 36 has a wider energy bandgap than the energy bandgap of the channel layer 32. The difference in these bandgap widths, in association with the undoped spacer layer 34, generates a potential well in the conduction-band edge at the heterojunction 40. Conduction electrons from the donor layer 36 are trapped in this potential well and form a 2DEG sheet 42 that adjoins the heterojunction 40. The conduction electrons of this sheet are free to move in a plane parallel to the heterojunction 40 but are restrained in the orthogonal direction in which the semiconductor layers are grown.

The cap 38 is usually formed from GaInAs and is necessary to isolate the Al in the donor layer from the atmosphere. Without the cap layer, the Al forms an oxide which inhibits the formation of effective ohmic contacts. One purpose of the buffer layer 28 is to provide a good morphology for fabrication of the subsequent layers. It also serves as a "getter" to block impurities from moving into the channel 32. The buffer material is typically of AlInAs. When this is the case, the channel 32 and buffer 28 meet at a second heterojunction 43.

The structure shown in FIG. 1 is an exemplary HFET device. The figure does not illustrate various HFET fabrication details which are well known in the art. For example, a Schottky layer and a second spacer layer, each of AlInAs, may be positioned beneath the cap layer 38 to adjoin the gate 25. The gate 25 and its associated semiconductor layers are typically arranged to distinguish an enhancement-type or a depletion-type device. HFET layers are generally epitaxially grown, e.g., by molecular beam epitaxy (MBE) or by metal-organic chemical vapor deposition (MOCVD).

In order to take advantage of the high-mobility electrons of the 2DEG sheet 42 which adjoins the heterojunction 40, the source and drain ohmic contacts 22 and 24 preferably extend through the donor layer 36 and the spacer layer 34 to communicate with the 2DEG sheet 42. This is schematically indicated by the broken extension lines 44 and 46 of the source and drain.

To form ohmic contacts, metal systems are typically deposited onto a heterostructure (e.g., by e-beam evaporization, thermal evaporation or sputtering) and then alloyed at a predetermined temperature and for a predetermined time. The temperature and time determine the depth of penetration of the deposited metals, with the penetration generally increasing with increased temperature and/or time. Accordingly, the temperature and time are preferably adjusted to obtain a penetration depth that minimizes the contact resistance between the source 22 and drain 24 and the 2DEG sheet 42.

For each selected alloying temperature, there is usually a corresponding window of time during which the lowest contact resistance is realized. Although the relationship between the contact resistance and the concentration profile of the alloyed metals is quite complex, the lowest contact resistance is generally obtained when the Ge is at its highest concentration at the 2DEG level. Alloying time that is less than or greater than this corresponding time window will yield less than optimum contact resistance, i.e., for each selected alloying temperature there is a corresponding, preferred alloying time window. If the elapsed time to reach the beginning of this time window is too short, e.g. <5 seconds, it is difficult to control the alloying process in a manner that produces consistent results.

For good process control, the alloying temperature is preferably selected so that the elapsed time to the corresponding time window is approximately 30–60 seconds. The elapsed time can be even longer, e.g. 2 minutes, although it has often been found that alloying times in excess of 2 minutes result in less than optimum contact resistance.

HFET reliability is dependent upon a variety of parameters. In the case of the ohmic contacts, it has been suspected that a higher alloying temperature produces greater contact reliability and, therefore, a higher alloying temperature is generally a desirable goal. However, excessively increasing the alloying temperature for a selected metal system often results in poor contact surface morphology which causes difficulty in subsequent fabrication steps, e.g., photolithographic alignment and interconnect application. In addition, a higher alloying temperature requires a shorter alloying time because, otherwise, the atoms of the metal system will be driven too deeply to obtain a low ohmic contact resistance to the 2DEG sheet. This shorter alloying time may itself degrade the contact resistance because of poor process control, as explained above.

Figure 2:
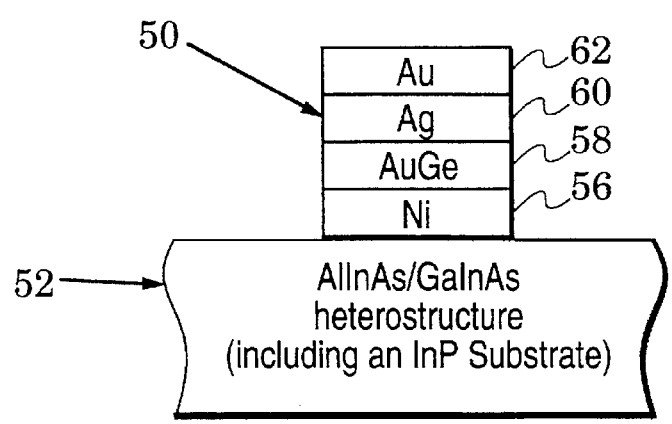
FIG. 2 is a sectional view of a metal system embodiment in accordance with the present invention, shown in association with an AlGaAs/GaInAs heterostructure.

In accordance with the present invention, FIG. 2 schematically illustrates a metal system 50 in association with an AlInAs/GaInAs heterostructure 52. In particular, the heterostructure has an $Al_xIn_{1-x}As/Ga_yIn_{1-y}As$ with x>0.48 alloy composition which obtains a lattice match with its InP substrate. The metal system 50 can be adjusted to obtain higher alloying temperatures with reasonable alloying times. The metal system 50 is deposited on the heterostructure 52 in sequentially ordered layers of Ni/AuGe/Ag/Au, i.e., the system has a Ni layer 56, a AuGe layer 58, a Ag layer 60 and a Au layer 62. The AuGe is preferably deposited in eutectic proportions. It has been discovered that the alloying temperature of the metal system 50 can be controlled by varying the thickness of the Ag layer 60 over a range of substantially 400–1200 Å. Further, the ohmic contacts, e.g., 22, 24 of FIG. 1, that are realized with the metal system 50 have low contact resistance and initial tests verify that the reliability of these contacts does increase with greater alloying temperature.

Figure 3:
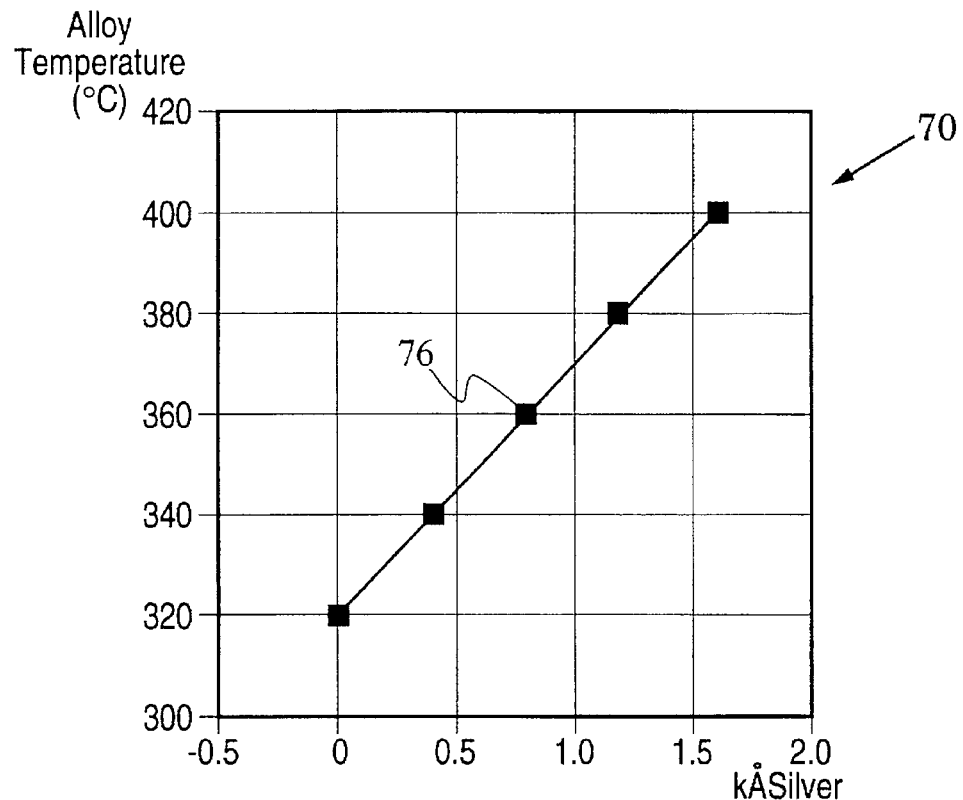
FIG. 3 is a graph which illustrates the relationship between alloying temperature and the thickness of the Ag layer in the metal system of FIG. 2.
Figure 4:
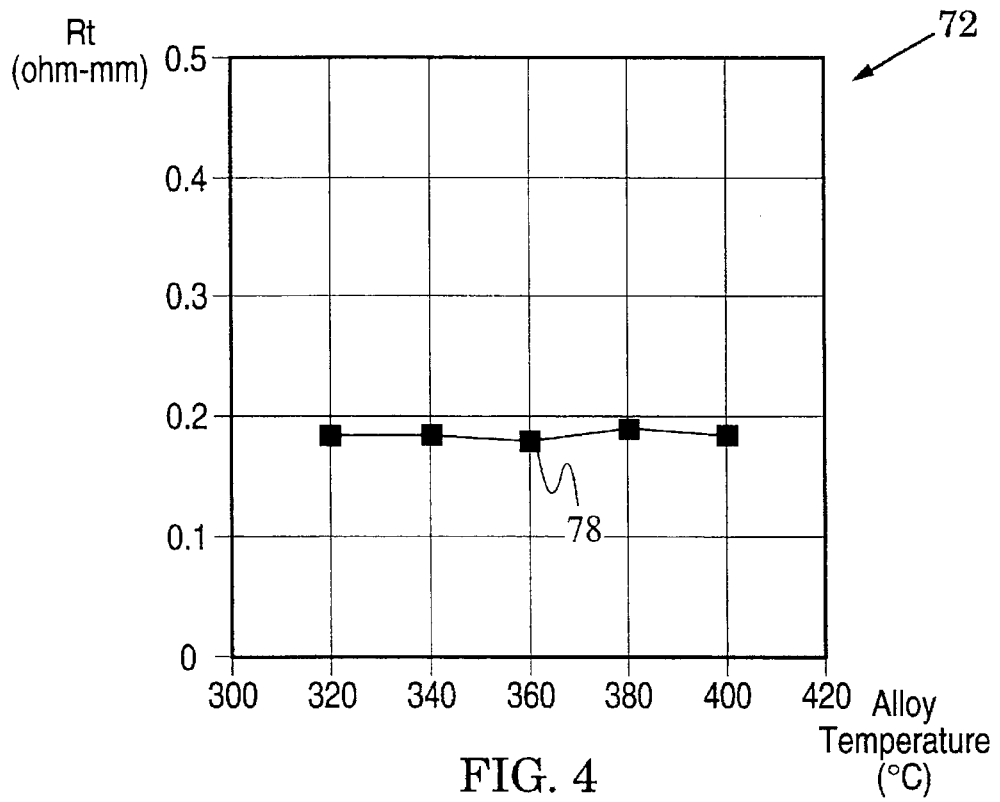
FIG. 4 is a graph which illustrates the contact resistance obtained with the metal system of FIG. 2 and the selected Ag thickness and alloying temperature combinations of FIG. 3.
Figure 5:
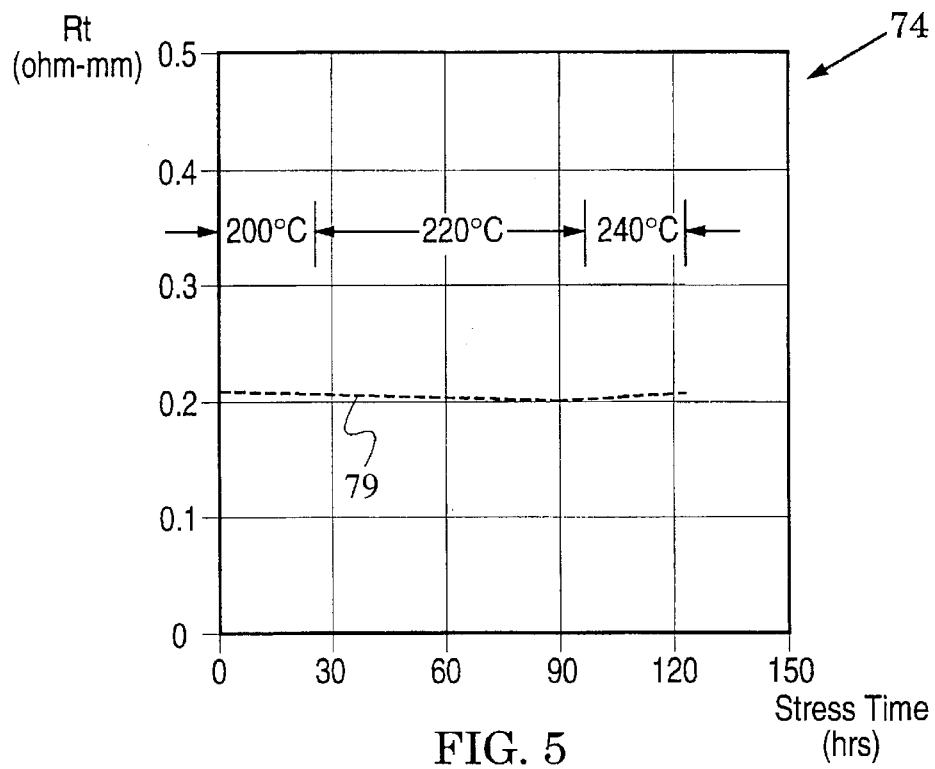
FIG. 5 is a graph which illustrates contact resistance as a function of stress temperature and time for ohmic contacts formed in accordance with the present invention.

The operation of this novel metal system can be illustrated with reference to its performance data, which are shown in FIGS. 3, 4 and 5. FIG. 3 is a graph 70 that plots alloying temperature with respect to the thickness of the Ag layer 60, FIG. 4 is a graph 72 that plots specific contact resistance $R_r$ with respect to alloying temperature and FIG. 5 is a graph 74 that plots contact resistance $R_r$ versus post-fabrication stress time and stress temperature. These graphs summarize test results on samples of $Al_xIn_{1-x}As/Ga_{0.47}In_{0.53}As$ heterostructures and metal systems which were fabricated in accordance with FIG. 2.

These samples were fabricated with ohmic contacts that were spaced to facilitate contact resistance measurement in accordance with the well-known transmission line measurement (TLM) technique. TLM is generally accepted as an accurate contact resistance measurement method (e.g., see R. E. Williams et al., G. K. Reeves et al. "Obtaining the Specific Contact Resistance from Transmission Line Measurements", *IEEE Electron Device Letters*, Vol. EDL-3,. No. 5, May, 1932, and Pallab Bhattacharya, *Semiconductor Optoelectronic Devices*, Prentice Hall, Englewood Cliffs, 1994, pp. 192–193). The measurement was modified in accordance with G. K. Reeves et al. to obtain a contact resistance that reflects current flow from contact edges which is particularly relevant to FET structures.

In these metal systems, the thickness of the Ni layer 56, the AuGe layer 58 and the Au layer 62 were respectively deposited to be substantially 100 Å, 900 Å and 1000 Å. In contrast, the Ag layer 60 was selectively deposited in thicknesses of 0, 400, 800, 1200 and 1600 Å. These metal systems were then alloyed at respective temperatures of 320°, 340°, 360°, 380° and 400° C., as indicated by the data points 76 in FIG. 3.

It was demonstrated that increased Ag thicknesses allowed the use of higher alloying temperatures with reasonable alloying times, e.g., 30–60 seconds, and, as shown by the data points 78 in FIG. 4, this was done without degrading the ohmic contact resistance. The contact resistance of the resultant ohmic contacts was also measured over time at elevated temperatures and this contact resistance data is plotted as the broken line 79 in FIG. 5. This test showed no significant degradation in contact resistance.

Finally, HFET samples were fabricated with metal systems that were formed in accordance with FIG. 2. These samples were divided into two groups. The metal systems of the first group were alloyed at 300° C. and those of the second group were alloyed at 320° C. These HFETs were then subjected to long-term temperature tests at selected ambient temperatures with monitoring of the field-effect transconductance $g_m$. Part failure, at each specific ambient temperature, was defined to be at the time when $g_m$ declined by 10% in one-half of the samples.

Figure 6:
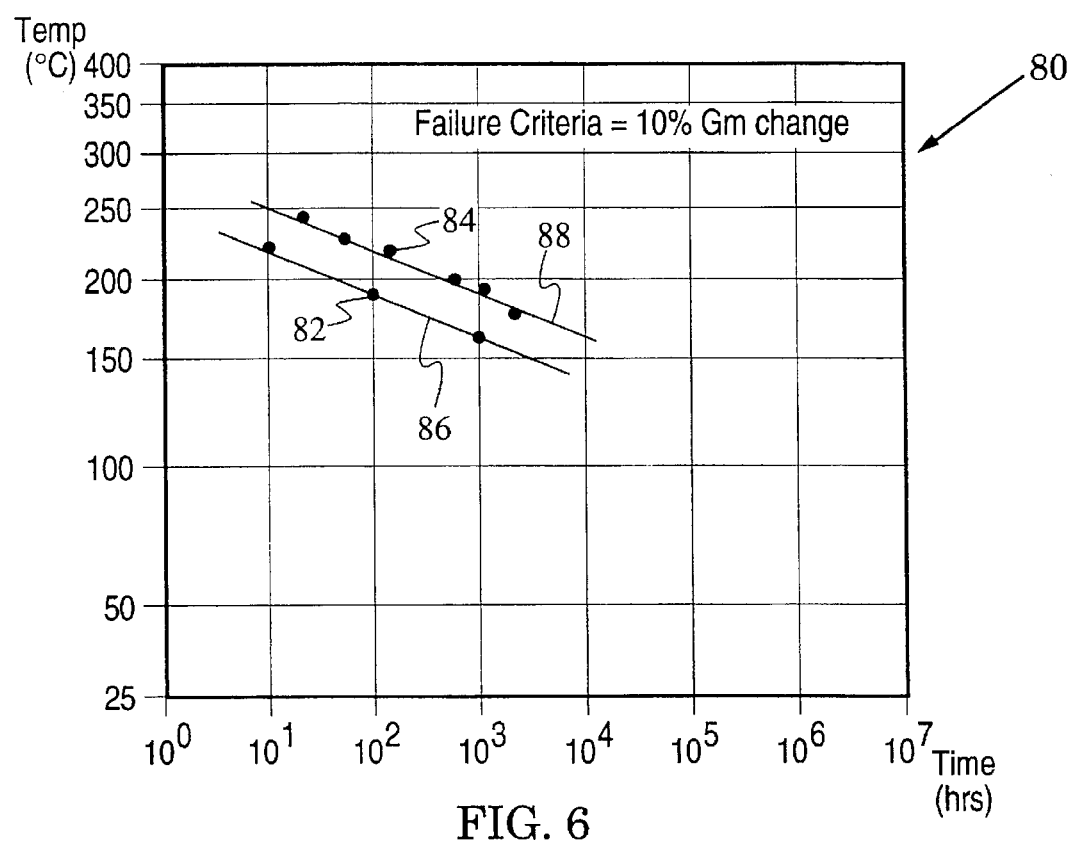
FIG. 6 is an Arrhenious graph which shows reliability data for HFETs with ohmic contacts formed in accordance with the present invention.

In the Arrhenious graph 80 of FIG. 6, the results for samples alloyed at 300° C. are plotted as the data points 82 and the results for samples alloyed at 320° C. are plotted as the data points 84. Lines 86 and 88 that are drawn through these data points show a clear correlation between higher metal system alloying temperature and device reliability (extensions of the lines 86 and 88 to an intercept with 45° C. indicate mean time to failure of $1e^{11.5}$ and $1e^{12.5}$ respectively). Because of the extensive fabrication and testing time required to generate Arrhenious data, only two exemplary alloying temperatures were investigated.

The measurement of alloying temperature is known to be highly dependent upon technique and will vary between different measurement setups (e.g., see R. E. Williams). Thus, it is the conceptual relationship between Ag thickness and alloying temperature that is exemplified by FIG. 3 rather than the exact temperatures shown for the data points 76. As shown in FIG. 3, the relationship has been tested to 400° C. Because HFET fabrication processes often involve temperatures in the range of 500° C., the metal system alloying temperature is preferably limited to some value below 500° C., e.g., 450° C.

An exemplary ohmic contact fabrication process, which can be used to practice the teachings of the invention, begins with a wafer which contains a HFET in the $Al_xIn_{1-x}As/Ga_yIn_{1-y}As$ semiconductor system. The wafer is patterned by use of a Shipley 1400-27D1 photoresist (Shipley Company, Inc., Marlborough, Mass.), a mask aligner or stepper and an Image Reversal Oven. The wafer is then exposed and developed in ways well known in the art. Next, the wafer is cleaned with an oxygen plasma followed by an Ammonium Hydroxide wet etch. An E-beam evaporator is used to deposit the metal system. The pattern is then lifted off in a solution of JT Baker's PRS-1000 (J. T. Baker, Inc., Phillipsburg, N.J.). This is followed by a deionized water rinse. The system is alloyed in a forming gas overpressure (~4% hydrogen) with a hotplate at the selected temperature and time. A variety of other heating techniques may be used to conduct the alloying, e.g., strip heaters, ovens, flash lamps and lasers.

The teachings of the invention are generally applicable to HFETs which are realized in a semiconductor system whose alloy proportions are substantially $Al_xIn_{1-x}As/Ga_yIn_{1-y}As$ with x>0.48. HFETs include structures sometimes referred to as selectively doped heterostructure transistors (SDHT), high electron mobility transistors (HEMT), two-dimensional electron gas FET (TEGFET) and modulation doped FET (MODFET). Well-known variations also include single quantum well HFETs, HFETs with superlattice donor layers and delta (δ) doping layers, heterostructure insulated gate FETs (HIGFET), and doped-channel HFETs.

Although the nominal deposited thicknesses of the Ni, AgGe and Ag layers are respectively 100 Å, 900 Å and 1000 Å, they can be adjusted to control various ohmic contact parameters, e.g., surface morphology and contact resistance. They are preferably selected from respective thickness ranges which are substantially 100+/−50 Å, 900+/−300 Å and 1000+/−Å.

Figure 7:
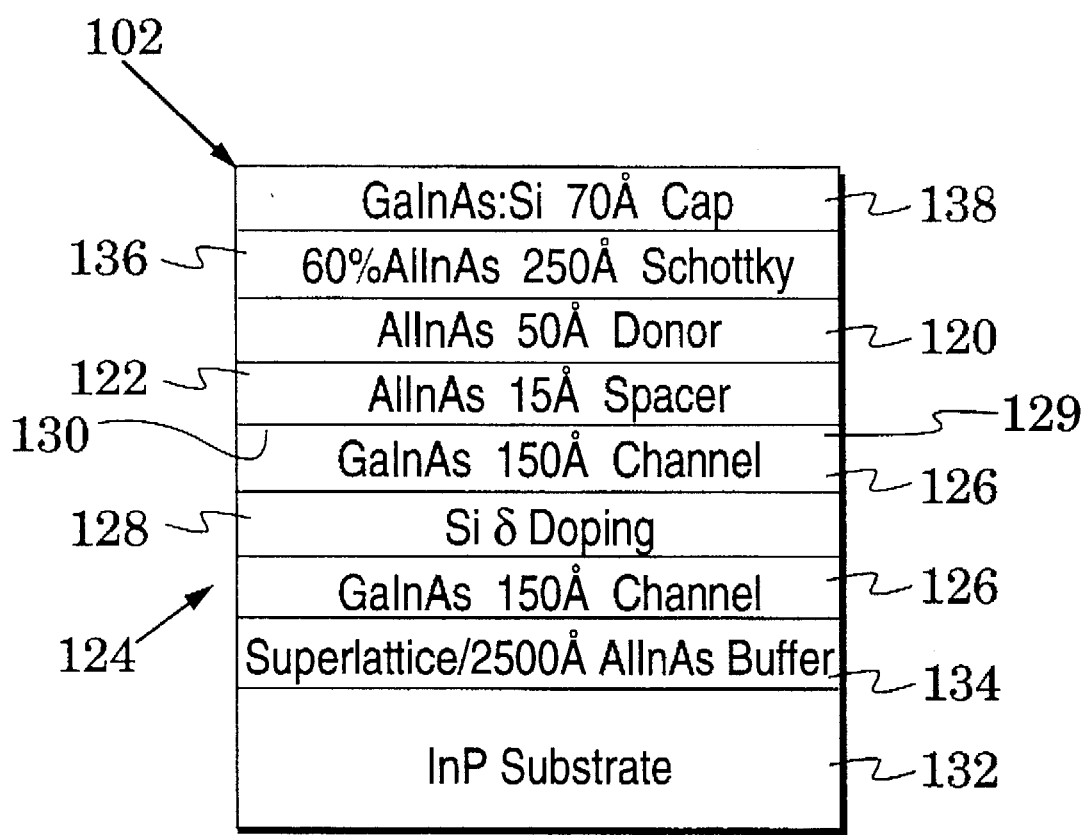
FIG. 7 is sectional schematic of an exemplary AlGaAs/GaInAs power heterostructure which is suitable for ohmic contacts that are formed in accordance with the present invention.

An exemplary heterostructure which can benefit from the teachings of the invention is shown in FIG. 7. This is a typical power HFET 102 which has a wide-bandgap doped AlInAs:Si donor layer 120 and a AlInAs spacer layer 122 which meet a channel 124 in the form of two narrow-bandgap GaInAs layers 126 that are separated by a Si δ-doped region 128. The δ-doped region enhances current density in the 2DEG region 129 adjoining the heterojunction 130. The channel 124 is separated from an InP substrate 132 by a AlInAs buffer 134 which includes a superlattice structure. Above the donor layer are an undoped $Al_xIn_{1-x}As$ with x=0.60 Schottky layer 136 and an undoped GaInAs:Si cap layer 138. Exemplary layer thicknesses in angstroms are indicated in FIG. 7.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of forming an ohmic contact through an $Al_xIn_{1-x}As$ semiconductor member to a $Ga_yIn_{1-y}As$ semiconductor member, wherein y is between 0 and 1, and x is between 0.48 and 1, said method comprising the steps of:

depositing, onto said $Al_xIn_{1-x}As$ semiconductor member, a metal system that has layers in the sequence of Ni/AuGe/Ag/Au, with said Ni layer adjoining said $Al_xIn_{1-x}As$ semiconductor member; and alloying said metal system for a alloy time greater than 5 seconds and at a alloy temperature in the range of 340–450 degrees Centigrade;

said Ag layer being deposited with a thickness in the range of 400–1600 Å at which thickness it causes said metal system to form an ohmic contact with said $Ga_yIn_{1-y}As$ semiconductor member when allowed at said alloy time and said alloy temperature.

2. The method of claim 1, wherein said depositing step includes the step of forming said Ni layer with a thickness substantially in the range of 50–150 Å.

3. The method of claim 1, wherein said depositing step includes the step of forming said AuGe layer with a thickness substantially in the range of 600–1200 Å.

4. The method of claim 1, said depositing step includes the step of forming said Au layer with a thickness substantially in the range of 500–1500 Å.

5. The method of claim 1, wherein said selected alloy temperature is approximately 340 degrees Centigrade and said Ag layer thickness is approximately 400 Å.

6. The method of claim 1, wherein said selected alloy temperature is approximately 360 degrees Centigrade and said Ag layer thickness is approximately 800 Å.

7. The method of claim 1, wherein said selected alloy temperature is approximately 380 degrees Centigrade and said Ag layer thickness is approximately 1200 Å.

8. The method of claim 1, wherein said selected ahoy temperature is approximately 400 degrees Centigrade and said Ag layer thickness is approximately 1600 Å.

* * * * *